(12) United States Patent
Lee et al.

(10) Patent No.: US 7,084,466 B1
(45) Date of Patent: Aug. 1, 2006

(54) LIQUID DETECTION END EFFECTOR SENSOR AND METHOD OF USING THE SAME

(75) Inventors: Won Lee, Albuquerque, NM (US); Evan E Patton, Portland, OR (US)

(73) Assignee: Novellus Systems, Inc., San Jose, CA (US)

( * ) Notice: Subject to any disclaimer, the term of this patent is extended or adjusted under 35 U.S.C. 154(b) by 149 days.

(21) Appl. No.: 10/315,296

(22) Filed: Dec. 9, 2002

(51) Int. Cl.
*H01L 27/14* (2006.01)

(52) U.S. Cl. ..................... 257/414; 414/935

(58) Field of Classification Search ........ 414/935–941; 118/500–503
See application file for complete search history.

(56) References Cited

U.S. PATENT DOCUMENTS

| | | | |
|---|---|---|---|
| 5,889,460 A | 3/1999 | Bachmann et al. | |
| 6,127,915 A | 10/2000 | Gam et al. | |
| 6,203,673 B1 | 3/2001 | Shoji et al. | |
| 6,232,618 B1 | 5/2001 | Wienand et al. | |
| 6,259,350 B1 | 7/2001 | Mueller-Fiedler et al. | |
| 6,365,036 B1 | 4/2002 | Polikarpus | |
| 2002/0006770 A1* | 1/2002 | Bachand et al. | 451/56 |
| 2002/0167322 A1* | 11/2002 | He et al. | 324/441 |
| 2003/0044268 A1* | 3/2003 | Bonora et al. | 414/935 |
| 2003/0136684 A1* | 7/2003 | Duboust et al. | 205/640 |
| 2003/0190873 A1* | 10/2003 | Wang et al. | 451/56 |

\* cited by examiner

*Primary Examiner*—Thanh Nguyen
(74) *Attorney, Agent, or Firm*—DeLio & Peterson LLC; Robert Curcio

(57) ABSTRACT

Liquid detection sensors are attached to both sides of a robotic arm end effector of a semiconductor wafer process system. The sensor mechanism or probe is situated on the front side and backside of the end effector, designed with electrical lines that are traced onto a polyester base material. The electrical lines are positioned in a serpentine formation. The high conductance of the sulfuric acid in the copper sulfate solution acts as the conductor between the traced lines. When the conductive liquid comes in contact with the traced lines, the lines short and the sensor activates or turns on.

8 Claims, 6 Drawing Sheets

LIQUID DETECTION END EFFECTOR SENSOR AND METHOD OF USING THE SAME

BACKGROUND OF THE INVENTION

1. Field of the Invention

The present invention relates to semiconductor wafer processing, and specifically to the detection of conductive solutions in semiconductor fabrication equipment used to process semiconductor wafers. More specifically, the present invention relates to detecting conductive fluids, including copper plating solution, which may destructively interact with the wafer during fabrication.

2. Description of Related Art

The semiconductor wafer fabrication process is vulnerable to destructive processing fluids that may inadvertently come in contact with the silicon wafer. Metal-containing fluids, a by-product of the fabrication process, have been shown to be extremely harmful to the wafer. In the instance of copper plating, the unintentional transfer of copper via plating solution to the back of a wafer can cause contamination in other process equipment, exposing a semiconductor wafer to contamination and degradation. This contamination can potentially shutdown an entire production line while steps are taken to eliminate the contaminant and mitigate the damage caused. Migration and diffusion of copper into the silicon wafer destroys the silicon devices during fabrication. Current fabrication tools, such as the SABRE Copper Electrofill System, and the like, do not currently make use of an apparatus or method for sensing acidic fluid excursions, such as copper sulfate.

Most semiconductor fabrication processes are automated with robotics to ensure safe, reliable, and efficient production techniques. The automated machinery includes a robotic arm to hold, manipulate and control the wafer, i.e., an end effector. The end effector is the chief handling feature of the robotic instrument. Wafers can be subjected to contaminants during handling and processing. Enhancing production efficiency while eliminating unwanted contaminants during wafer handling presents technical challenges to equipment modifications and implementation.

During normal operation, it is desirable to have copper plating solution contained within and by the plating cells. However, backside contamination of the wafer by copper sulfate may happen through a number of means. In the Sabre Copper Electrofill System, for example, a semiconductor wafer is taken out of its cassette, and placed face-side down in the clamshell. The clamshell is a fixture used to hold the wafer during copper electroplating. The clamshell clamps the wafer, seals the periphery of the face, makes electrical contact with the wafer, and seals the wafer's backside. When the wafer is dropped into the plating solution, it becomes vulnerable to contamination. One form of contamination, called Lip Seal or Clamshell contamination, occurs when the seal around the outer diameter of the wafer, i.e., the lip seal, fails. The clamshell submerges into the plating cell during the electroplating process. Wafers are transferred to and from the clamshell and secured to the clamshell using a vacuum. The solution commonly used for electroplating copper, acid-copper, is composed primarily of dilute sulfuric acid (~0.01–20%), copper ions in the form of copper sulfate (15–55 g/l), chloride ions in the form of HCl (10–100 ppm), and ppm-levels of organic additives to control film properties. The plating solution may traverse around the seal in a failure mode, and ultimately come in contact with the edge of the silicon wafer. The copper in the plating solution can contaminate the wafer upon contact. In this failure mode, most of the copper sulfate will be concentrated on and about the circumference of the wafer. The robot end effector could then be contaminated when picking the wafer from the clamshell after the failure. This type of failure is a potentially destructive failure mode that must be addressed during the fabrication process.

A second form of contamination is spray out from plating cells. A plating cell is a reservoir that contains copper sulfate. The clamshell submerges into the plating cell during the electroplating process. Spray out is a main pathway for contaminating the end effector on a regular basis. The wafer is rotated after plating at high speed. During the wafer rinse, the rotations can generate a mist, or spray out. This spray out can cause copper contamination on the end effector at any location in the system. Normally, the spray out is contained at the plating cell shields; however, when this containment breaks down, destructive contamination can occur. One safety mode that may be employed requires software algorithms to command the fabrication robot to retreat to a safe location between processes. In this situation, the end effector is flipped when the robot begins an idle mode.

The robotic instrument itself can become contaminated once copper sulfate is introduced into the vacuum chamber. The robotic arm or end effector uses an injection of nitrogen (an "$N_2$ puff") to release the wafer; however, the nitrogen gas is capable of carrying copper particles and placing them on the backside of the wafer. Usually, when the end effector reaches this state of contamination, excessive spray out or lip seal contamination has already been realized.

Edge or backside copper contamination is an unwanted by-product of the semiconductor wafer fabrication process. A sensor that detects the presence of copper plating solution and other conductive solutions can reduce the likelihood of this kind of contamination.

Bearing in mind the problems and deficiencies of the prior art, it is therefore an object of the present invention to provide a sensor that can be easily adapted to an end effector of an automated semiconductor process robot for detection of conductive fluids.

It is another object of the present invention to provide a sensor that is capable of covering the acid path for both sides of an end effector of a semiconductor process robotic instrument.

It is a further object of the present invention to provide detection of copper sulfate at the source of the contamination in a semiconductor wafer fabrication process.

It is yet another object of the present invention to provide a sensor for a semiconductor wafer processing system capable of detecting failure from clamshell or excessive spray out from the plating cell.

It is a further object of the invention to provide for a method of operation to eliminate acid contamination in a wafer transfer robotic arm.

Still other objects and advantages of the invention will in part be obvious and will in part be apparent from the specification.

SUMMARY OF THE INVENTION

The above and other objects, which will be apparent to those skilled in art, are achieved in the present invention, which is directed to, in a first aspect, an apparatus for measuring liquid contaminants in a semiconductor wafer fabrication process comprising a sensor having a sensing mechanism situated on an end effector adapted to hold the semiconductor wafer, the sensor capable of detecting conductivity changes as the liquid contaminants come in contact with the sensing mechanism. The apparatus includes having the sensing mechanism further comprise metal traces bonded in a serpentine pattern on the end effector, bonded on the backside of the end effector, and/or bonded on the front side of the end effector. The apparatus may also include having the sensing mechanism further comprise metal traces bonded on the end effector about the periphery of the semiconductor wafer. The sensing mechanism may comprise metal traces of platinum, palladium, tantalum, gold, or titanium.

In a second aspect, the present invention is directed to a sensor for detecting a conductive liquid exposed to a semiconductor wafer within a semiconductor wafer process comprising: an electronic circuit adapted to detect changes in electrical conductivity; a sensor probe comprising at least one metal trace connected to the electronic circuit, the at least one metal trace exposed on at least one side to come in contact with the conductive liquid; and, an end effector attached to a robotic arm, the end effector holding the semiconductor wafer, having a front side and a backside, and adapted to adhesively hold the at least one metal trace. The sensor includes having the electronic circuit adapted to measure changes in electrical conductivity of the conductive liquid. The sensor probe further includes the at least one metal trace having approximately 0.020" to 0.050" line pitch. The sensor probe may comprise the at least one metal trace having a line width of 0.015" and a line height of approximately 0.002" to 0.003". The sensor probe may further comprise the at least one metal trace having a spacing of 0.020" from the wafer to the top of the at least one metal trace. The sensor may comprise having the electronic circuit configured as an electrical "OR" signal detector to measure independently a signal from the at least one metal trace bonded on the backside of the end effector, or a signal from the separate metal trace bonded on the front side of the end effector.

In a third aspect, the present invention is directed to a method for detecting conductive liquid in a semiconductor wafer fabrication process comprising: sending an electrical signal via metal lines of a sensor probe attached to an end effector of a robotic semiconductor process system; detecting a change in electrical continuity in the metal lines using electronic circuitry; and changing the operation of the robotic semiconductor process system based on detecting the change in electrical continuity. The method may further include: reporting an error when the change in electrical conductivity is detected after the robotic semiconductor process system completes a move command; allowing a subsequent move command only after the conductive liquid has been removed from the robotic semiconductor process system; and reporting an error prior to a move command if the robotic semiconductor process system is in an idle state when the conductive liquid is detected.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–6 of the drawings in which like numerals refer to like features of the invention.

Figure 1:
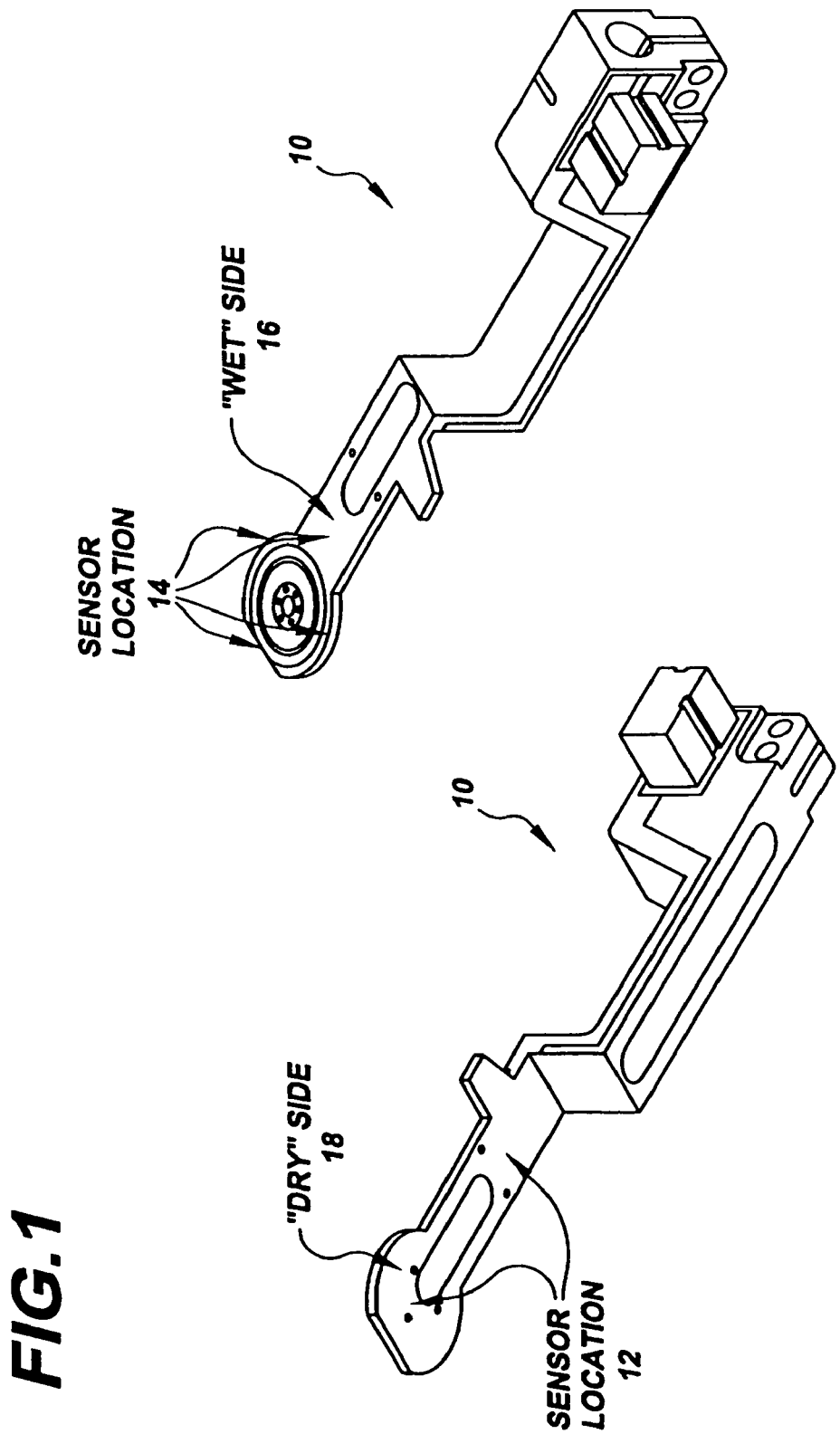
FIG. 1 is a schematic of the overall view of the end effector, depicting sensor probe locations on the wet side and dry side.

An end effector is essentially the end of a robotic arm used to handle and manipulate a semiconductor wafer during the manufacturing process. The end effector employed is double sided, effectively defined as having two distinct sides, a "wet" or dirty side and a "dry" or clean side. Inert materials such as titanium, high-purity plastics, and ceramics are often used in corrosive environment applications. The wafer is present on the "dry" side of the end effector, while a ceramic contact surface is typically used on the "wet" side to eliminate titanium excursions from contact with the titanium end effector. In the present invention, the wet side uses the vacuum grip for wafer transfer, while the dry side uses a friction grip. FIG. 1 is a schematic of the overall view of the end effector 10, depicting sensor probe locations 12, 14 on the wet side 16 and dry side 18. The friction surface for the dry side will utilize an elastomer such as VITON®, and the like.

The current robotic solution used to satisfy the backside contamination problem is called a dual end effector robot. It requires two opposing end effectors where one end effector is defined as the "wet" end effector and the other end effector is identified as the "dry" end effector.

Generally, two sizes of end effectors are used in the semiconductor process industry; a 200 mm end effector, and a 300 mm end effector. Any sensing mechanism placed on the end effector will be restricted in thickness by the size of the end effector. For example, a sensing mechanism having a 2 mm total stack thickness has been shown to be an optimum sensor thickness for a 200 mm end effector. Similarly, a 2.5 mm thick sensing mechanism design may be used successfully for the 300 mm end effector because in the cassette the spacing between the wafers is greater. Due to the corrosive effect of the acids being detected, sensor materials that may be employed must be resistive to acid degradation. This includes any attachment method used to secure the sensing mechanism portion of the sensor to the end effector. Sensing mechanism materials that can withstand a harsh acidic environment, such as a copper sulfate exposure, include platinum, palladium, tantalum, gold, titanium, and the like. The sensor's electronics would use the sensing mechanism as a probe.

Figure 2:
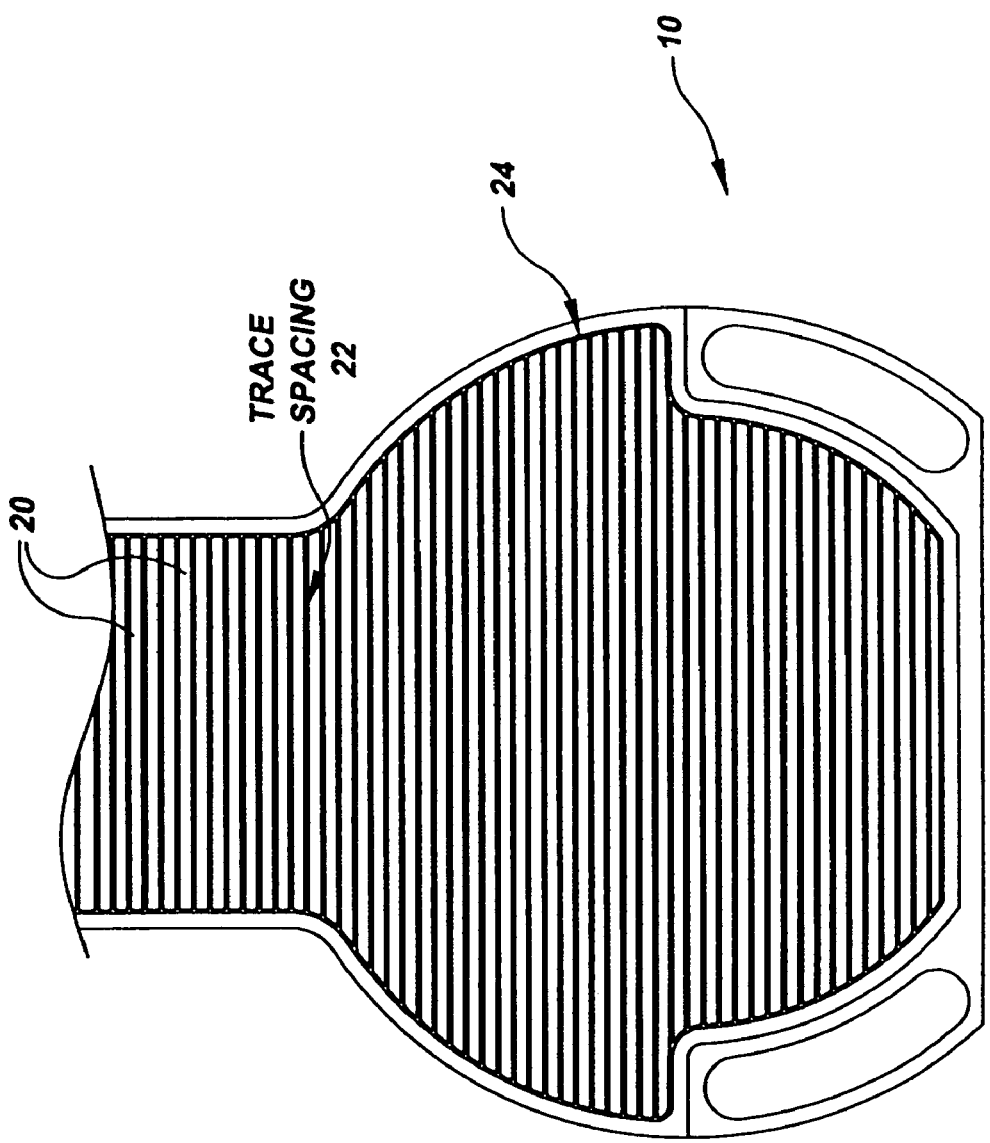
FIG. 2 depicts the Liquid Detection End Effector Sensor on the end effector backside.
Figure 3:
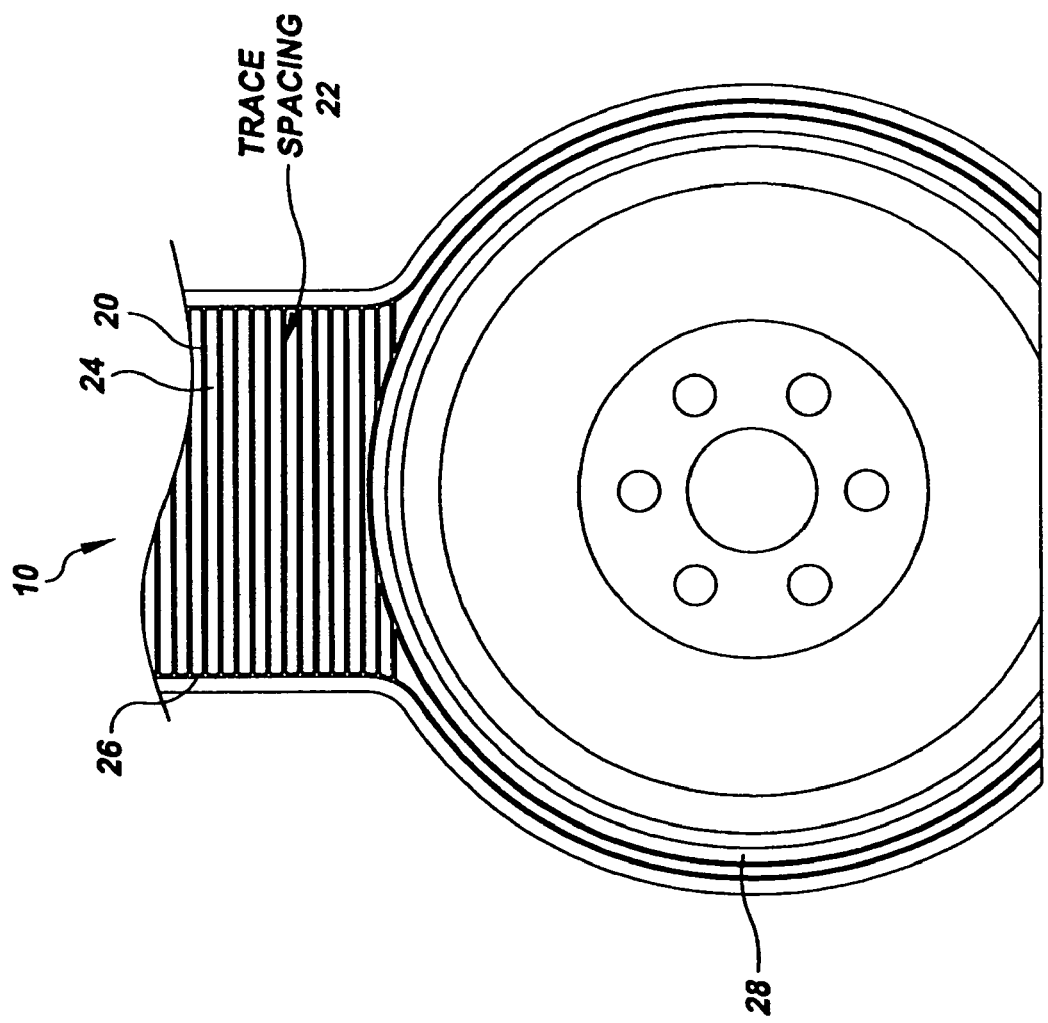
FIG. 3 depicts the Liquid Detection End Effector Sensor on the end effector front side.
Figure 4:
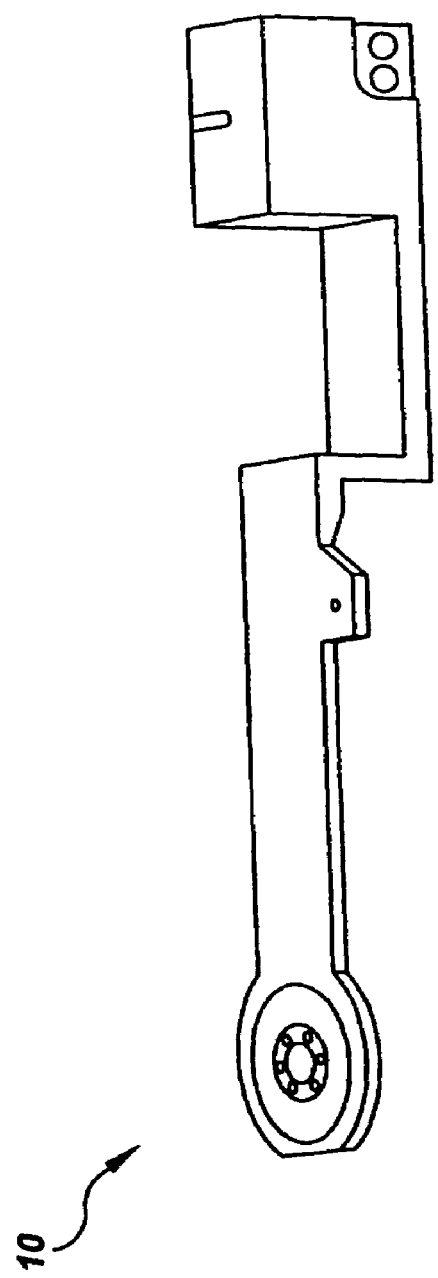
FIG. 4 depicts a front side view of the complete end effector with the Liquid Detection Sensor.

In the present invention, liquid detection sensors are attached to both sides of the end effector. Referring to FIG. 2, the preferred embodiment of the sensor mechanism or probe is depicted on the backside of an end effector 10, having a sensor designed with platinum electrical lines or traces 20 that are spaced apart 22 and traced onto a polyester base material 24. In general, the base material will be about a 3 mils thick sheet of polyester with pressure sensitive adhesive backing. The electrical lines are positioned in a serpentine formation. The high conductance of the sulfuric acid in the copper sulfate solution will act as the conductor between the traced lines. When the conductive liquid comes in contact with the traced lines, this shorts the lines and the sensor activates or turns on. The sensing mechanism may be secured with any adhesive that can be applied to a titanium end effector and survive the acidic environment. FIG. 3 depicts the sensing mechanism on the front side or wet side of the end effector, showing sensor probe trace spacings 22 along the end effector "neck" 26. Sensor probe lines or traces 28 are also shown along the periphery of the clamshell. FIG. 4 depicts a front side or wet side view of the complete end effector 10 with the Liquid Detection Sensor.

Table I compares a Dual Robot (Anneal) to a Double Sided End Effector of the instant invention for different modes of contamination. RPN ratings are given and compared for each mode. An RPN rating is a Failure Mode Effects Analysis (FMEA) calculation based on a) severity, b) likelihood, and c) prevention. The RPN rating represents a multiplicative factor of ratings for severity, likelihood, and prevention. For example, backside flooding has been analytically estimated to have a severity rating of 10, a likelihood rating of 3, and a prevention rating of 3, which yields an RPN rating of 10×3×3=90. A high RPN number indicates a serious failure mode.

As indicated by Table I, the Double Sided End Effector, i.e., end effector having a liquid detection sensor on both sides, has a lower RPN number, which means there will be less of a chance for a serious failure mode because of the detection of contaminants.

TABLE I

| Contamination Paths | Dual Robot (Anneal) | RPN Rating | Double Sided End Effector | RPN Rating |
|---|---|---|---|---|
| ANALYSIS FOR BACKSIDE CONTAMINATION | | | | |
| Backside Flooding | contaminates "wet" end effector and robot internals no backside contamination due to backside etch in post electrofill module and "dry" end effector wafer transfer to cassette failure of liquid detection does not contaminate wafers | 90 | contaminates "wet" end effector and robot internals detection and recovery of backside liquid level exceed thickness of end effector and contaminates "dry" side detection and recovery from liquid dripping from cone onto "dry" side of end effector during wafer transfer failure of liquid detection sensor contaminates wafer | 90 |
| Spray Out | Detection and recovery from spray out contamination contamination of "dry" end effector without detection | 350 | detection and recovery form spray out contamination | 210 |
| Incoming wafers contaminated | contamination from robot and all wafers going back to cassette from process | 160 | isolates contamination to "wet" side of end effector only | 60 |
| PM (contact by FSE) | contaminates both end effectors on both robots | 160 | contaminates both sides of end effector | 60 |
| Total RPN | | 760 | | 420 |

The signal of each sensor is configured by the sensor electronics as an electrical "OR" signal, so that the sensors will trigger detection of a contaminant. The liquid sensor on the "wet" end effector is only required to be on the vacuum side, and the sensor on the "dry" end effector is only required to be on the topside. No mapping is required for the dual end effector robot configuration. The sensor electronics are packaged such that it fits within the framework of the robotic arm's wrist housing. Integration with the printed circuit board within the robotic arm's wrist housing is preferred, but not required.

All metal-ion-containing fluids that can be exposed to the silicon wafer are conductive. The sulfuric acid and copper ions in plating solution act as a conductor between the traced electrical lines. One way to detect the presence of these acids is to account for the change in conductivity. The proposed end effector sensor is capable of measuring conductivity in the 100 microsiemen to 100 millisiemen range, which will effectively measure the conductivity of the types of acids used within the wafer fabrication process, including copper sulfate. By having a double-sided end effector with a sensor probe on each side, it is possible to separate the wafer handling before and after the electrofilling in a clamshell.

Platinum sensors have been investigated and represent a preferred embodiment. Platinum sensors shown having between 0.020" to greater than 0.050" line pitch are optimum for liquid detection. Additionally, sensors having a line width of 0.015" and a line height (thickness) of 0.002" to 0.003" worked sufficiently well in detecting acid. A spacing of 0.020" from the wafer to the top of the sensor yielded a good sensitivity with acceptable false-positive performance.

The sensor embodiments may be fabricated from a photo chemical machined (PCM) process. Sensors made of titanium have been developed using this process, with the titanium sensors having a KAPTON® back adhesive. Other similar adhesives may also be used.

Figure 5:
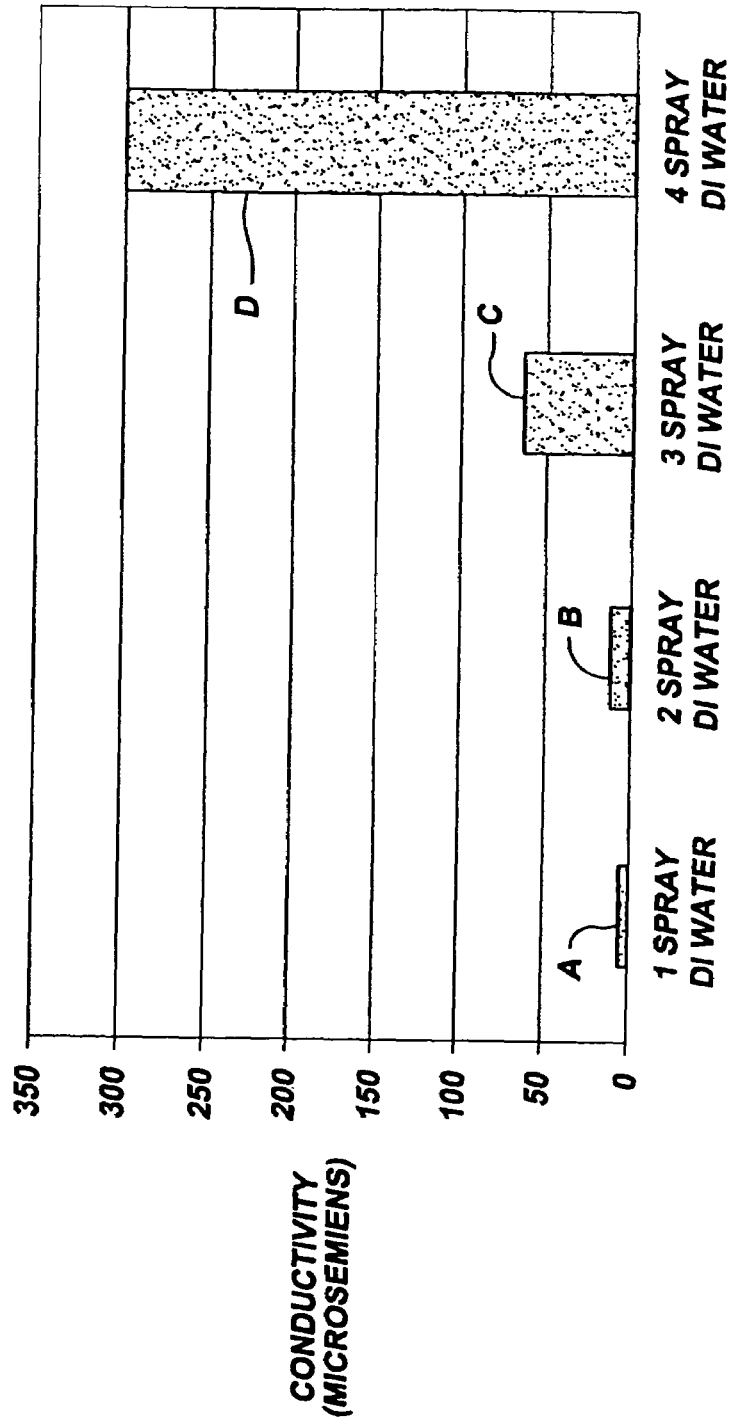
FIG. 5 is a graph of a test case of an end effector with a liquid detection sensor under standard operating environmental conditions, using deionized water.
Figure 6:
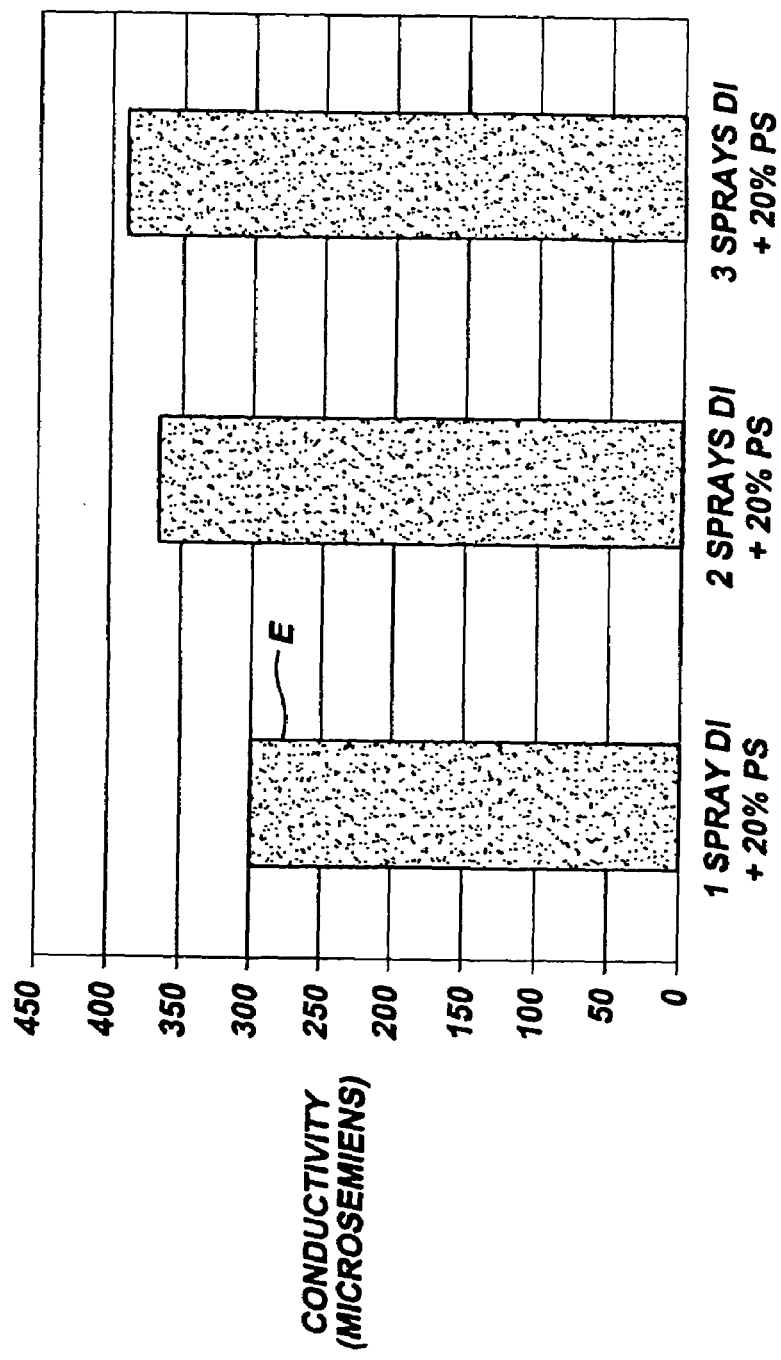
FIG. 6 is a graph of the end effector of FIG. 4 under the test case of using a plating solution.

FIG. 5 is a graph of a test case of an end effector under standard operating environmental conditions. In this first instance, a spray bottle of deionized (DI) water is used approximately two feet from the end effector. After one spray, as indicated by bar A, the sensor measures less than 10 microseimens conductivity. After two sprays, bar B shows a relatively small increase in conductivity to approximately 10 microseimens. A measurable increase in conductivity is detected after three sprays to over 60 microseimens, bar C. Last, as shown by bar D, a significant increase is associated with four sprays of deionized water at the end effector, measuring a conductivity value of 300 microseimens. Under the same conditions, a 20% mixture of plating solution is added to the deionized water. FIG. 6 depicts the results under these conditions. A noticeable increase in conductivity is detected after just one spray of deionized water with the conductive mixture added. Bar E depicts the lowest conductivity measured at 300 microseimens. Additional sprays of the solution bring the conductivity well over 350 microseimens. Thus, the end effector liquid detection sensor is capable of distinguishing between non-conductive and conductive solutions without registering false-positive readings.

Robot functionality will necessarily be altered to accommodate liquid detection. For example, if liquid is detected during the wafer move, i.e., picked from the clamshell, an error may be reported after the robot's "move command" finishes, shutting down the tool. However, after error recovery, the next "move command" to the robot should not be enabled since the liquid will not have been cleared. Once the liquid is cleared, the next "move command" would then be allowed. If, however, liquid were detected when the robot is idle, i.e., waiting to pick a wafer, an error would be reported when the next "move command" is issued. The robot does not start a move. If the error is cleared, the robot is still not allowed to move until the liquid is cleared. Once the liquid is cleared, the next "move command" would then be allowed.

The method of detecting liquid contaminants during a semiconductor fabrication process relies on the sensor electronic circuitry for detecting a change in conductance or resistivity of the sensor probe line, and signaling the robotic instrumentation to alter its normal functions, treating the wafer as potentially contaminated. The electronic circuitry will send a signal to the sensor probe that will change measurably if conductive liquid electrically shorts the probe's lines. The difference on conductivity will alert the system of the presence of a contaminant.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A sensor for detecting a conductive liquid exposed to a semiconductor wafer within a semiconductor wafer process comprising:
    an electronic circuit adapted to detect changes in electrical conductivity;
    a sensor probe comprising at least one metal trace connected to said electronic circuit, said at least one metal trace exposed on at least one side to come in contact with said conductive liquid, and bonded in a serpentine pattern on said end effector on said backside and said front side of said end effector; and,
    an end effector attached to a robotic arm, said end effector holding said semiconductor wafer, and having a front side and a backside, and adhesively holding said at least one metal trace;
    said electronic circuit configured as an electrical "OR" signal detector to measure independently a signal from said at least one metal trace bonded on said backside of said end effector, or a signal from said separate metal trace bonded on said front side of said end effector.

2. The apparatus of claim 1 including having said sensor further comprise metal traces bonded on said end effector about the periphery of said semiconductor wafer.

3. The apparatus of claim 1 wherein said sensor further comprises metal traces of platinum, palladium, tantalum, gold, or titanium.

4. The apparatus of claim 1 comprising said sensor traced onto a polyimide base material.

5. The apparatus of claim 1 wherein said sensor is applied to said end effector by an adhesive.

6. A sensor for detecting a conductive liquid exposed to a semiconductor wafer within a semiconductor wafer process comprising:
    an electronic circuit detecting changes in electrical conductivity, said electronic circuit configured as an electrical "OR" signal detector to measure independently a signal from at least one metal trace bonded on a backside of said end effector, or a signal from a separate metal trace bonded on a front side of said end effector;
    a sensor probe comprising said at least one metal trace connected to said electronic circuit, said at least one metal trace exposed on at least one side to come in contact with said conductive liquid, wherein said at least one metal trace is bonded in a serpentine pattern on said end effector, and bonded on said backside and said front side of an end effector; and,
    said end effector attached to a robotic arm, said end effector holding said semiconductor wafer, and having said front side and said backside, and adhesively holding said at least one metal trace, said sensor probe mounted in its entirety on said end effector and detecting conductivity changes in said liquid when said liquid comes in contact with said sensor probe.

7. The apparatus of claim 6 wherein said sensing mechanism further comprises metal traces of platinum, palladium, tantalum, gold, or titanium.

8. The apparatus of claim 6 comprising said sensing mechanism traced onto a polyimide base material.

* * * * *